US008067484B2

(12) United States Patent
Ying et al.

(10) Patent No.: US 8,067,484 B2
(45) Date of Patent: *Nov. 29, 2011

(54) LATENT HARDENER WITH IMPROVED BARRIER PROPERTIES AND COMPATIBILITY

(75) Inventors: Yurong Ying, Fremont, CA (US); John J. McNamara, El Sobrante, CA (US); Jing Liang, Walnut Creek, CA (US); Rong-Chang Liang, Cupertino, CA (US)

(73) Assignee: Trillion Science, Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/762,892

(22) Filed: Apr. 19, 2010

(65) Prior Publication Data

US 2011/0220401 A1 Sep. 15, 2011

Related U.S. Application Data

(60) Provisional application No. 61/313,199, filed on Mar. 12, 2010.

(51) Int. Cl.
*B32B 27/38* (2006.01)
*C08L 63/00* (2006.01)
*C08L 63/02* (2006.01)
*C08L 63/04* (2006.01)
*H05K 1/03* (2006.01)

(52) U.S. Cl. ...... 523/201; 174/259; 428/414; 525/92 H; 525/113; 525/438; 525/454; 525/502; 525/531

(58) Field of Classification Search ............... None
See application file for complete search history.

(56) References Cited

U.S. PATENT DOCUMENTS

| | | | |
|---|---|---|---|
| 2,795,572 A | 6/1957 | Muller | |
| 4,123,450 A | 10/1978 | Weber | |
| 4,647,631 A * | 3/1987 | Noguchi et al. ............... | 525/510 |
| 4,833,226 A | 5/1989 | Ishimura et al. | |
| 5,212,044 A | 5/1993 | Liang | |
| 5,219,956 A | 6/1993 | Fukuoka | |
| 5,357,008 A | 10/1994 | Tsai et al. | |
| 5,480,957 A | 1/1996 | Muroi et al. | |
| 5,543,516 A | 8/1996 | Ishida | |
| 5,548,058 A | 8/1996 | Muroi et al. | |
| 5,554,714 A | 9/1996 | Muroi et al. | |
| 5,561,204 A | 10/1996 | Muroi et al. | |
| 5,567,792 A | 10/1996 | Muroi et al. | |
| 5,591,814 A | 1/1997 | Muroi et al. | |
| 5,843,251 A | 12/1998 | Tsukagoshi et al. | |
| 5,880,229 A | 3/1999 | Kokura et al. | |
| 6,207,786 B1 | 3/2001 | Ishida | |
| 6,225,440 B1 | 5/2001 | Ishida | |
| 6,328,844 B1 | 12/2001 | Watanabe et al. | |
| 6,437,026 B1 | 8/2002 | Garrett | |
| 6,743,852 B2 | 6/2004 | Dershem | |
| 6,846,559 B2 | 1/2005 | Czaplicki et al. | |
| 6,899,960 B2 | 5/2005 | Shi | |
| 7,179,684 B2 | 2/2007 | Shi | |
| 7,438,782 B2 | 10/2008 | Sheasley et al. | |
| 7,847,026 B2 * | 12/2010 | Bertsch et al. ............... | 525/113 |
| 2002/0038041 A1 | 3/2002 | Clements et al. | |
| 2004/0204551 A1 | 10/2004 | Czaplicki et al. | |
| 2006/0128835 A1 | 6/2006 | Usui et al. | |
| 2006/0210805 A1* | 9/2006 | Mizuno ......................... | 428/413 |
| 2006/0280912 A1 | 12/2006 | Liang et al. | |
| 2007/0010636 A1 | 1/2007 | Kamiya et al. | |
| 2007/0055039 A1 | 3/2007 | Usui et al. | |
| 2007/0088039 A1 | 4/2007 | Balog et al. | |
| 2007/0095475 A1 | 5/2007 | Hable et al. | |
| 2007/0212551 A1 | 9/2007 | Collins | |
| 2007/0244268 A1 | 10/2007 | Usui et al. | |
| 2007/0270515 A1 | 11/2007 | Chmielewski et al. | |
| 2008/0090943 A1 | 4/2008 | Xu et al. | |
| 2008/0188609 A1 | 8/2008 | Agarwal et al. | |
| 2008/0249257 A1 | 10/2008 | Masuko et al. | |
| 2008/0249258 A1 | 10/2008 | Masuko et al. | |
| 2008/0251757 A1 | 10/2008 | Yamamoto et al. | |
| 2008/0308212 A1 | 12/2008 | Sheasley et al. | |
| 2009/0181165 A1 | 7/2009 | Liang et al. | |

FOREIGN PATENT DOCUMENTS

| | | |
|---|---|---|
| EP | 0459745 | 12/1991 |
| EP | 0552976 | 7/1993 |
| EP | 1557438 | 7/2005 |
| EP | 1731545 | 12/2006 |
| EP | 1852452 | 11/2007 |
| EP | 1980580 | 10/2008 |
| WO | 87/05600 | 9/1987 |

OTHER PUBLICATIONS

Derwent accession No. 2004-735065 for Russian Patent No. 2,228,346 C1, Bogomolova et al., May 10, 2004, one page.*
Derwent accession No. 2009-E74443 for Korean Patent No. 2008-102823 A, Dae, Nov. 26, 2008, two pages.*
Barton, J.M. et al., "The Curing Reaction of an Epoxide Resin with 2-Ethyl-4-methylimidazole, a Calorimetric Study of the Kinetics of Formation of Epoxide-Imidazole Adducts," *Die Makromolekulare Chemie*, 176, pp. 919-930 (1975).
Heise, M.S. et al., "Curing Mechanism and Thermal Properties of Epoxy-Imidazole Systems," *Macromolecules*, vol. 22, No. 1, pp. 99-104 (1989).
Colclaser, Roy A., *Microelectronics: Processing and Device Design*, Chapter 8, pp. 163-182, John Wiley & Sons (1980).
Heise, M.S. et al., "Mechanism of 2-Ethyl-4-methylimidazole in the Curing of the Diglycidyl Ether of Bisphenol A," *Journal of Polymer Science: Part C: Polymer Letters*, vol. 26, pp. 153-157 (1988).
Shriner et al., *The Systematic Identification of Organic Compounds*, 1980, pp. 348-350, 6th Ed., John Wiley & Sons, USA.
Petrie, *Epoxy Adhesive Formulations*, 2006, pp. 126-127, 136, McGraw-Hill Publishers, USA.

* cited by examiner

*Primary Examiner* — Robert Sellers
(74) *Attorney, Agent, or Firm* — Thompson Hine LLP

(57) ABSTRACT

A curing agent for epoxy resins that is comprised of the reaction product of an amine, an epoxy resin, and an elastomer-epoxy adduct; compositions containing the curing agent and an epoxy resin; the compositions are useful in electronic displays, circuit boards, semi conductor devices, flip chips and other applications.

3 Claims, 6 Drawing Sheets

LATENT HARDENER WITH IMPROVED BARRIER PROPERTIES AND COMPATIBILITY

CROSS REFERENCE TO RELATED APPLICATION

This application claims the benefit of U.S. Provisional Application Ser. No. 61/313,199 filed Mar. 12, 2010, the contents of which are hereby incorporated by reference.

FIELD OF THE INVENTION

This invention relates to latent hardeners for epoxy resins and, more particularly, to latent hardeners comprised of a core material that is encapsulated or coated in a step-wise manner with two or more shell materials.

BACKGROUND OF THE INVENTION

Epoxy adhesives have been known for over 50 years and were one of the first high temperature adhesives to become commercialized. Once cured, the material retains its adhesive properties over a large range of temperatures, has high shear strengths, and is resistant to weathering, oil, solvents, and moisture. The adhesive is available commercially as either a 1-part adhesive or 2-part adhesive and is available in several forms, such as pastes, solvent solutions, and supported films. Of the three forms, the 1-part adhesive film generally provides good adhesive strength with better thickness uniformity and has found practical use in the development of anisotropic conducting films for electronics, most notably flat panel displays.

To construct a 1-part adhesive film, one typically combines all at once, a latent hardener, multi-functional epoxy resins, phenoxy resins, additives, and optionally fillers. This composition is then cast as a film on a release layer. During the bonding process, the adhesive is transferred to one particular surface and the release layer removed. Another surface is brought into contact with the film, and the adhesive hardened or cured into a strong thermosetting adhesive through the application of heat and/or pressure. In this example, the two components of the adhesive that enable the material to cure into a thermoset adhesive are the hardener and the multi-functional epoxy. It is the later, that sets up the cross-linked network, but it is the former that enables this to happen. During the curing process, the latent hardener initiates the polymerization of the multi-functional epoxy by first forming ring-opened adducts with the oxiranes of the epoxy resin. Once produced, the addition products cause a cascade of ring-opened species that propagate through the adhesive, finally producing a cross-linked thermoset material.

The active ingredient of the hardener is usually comprised of the reaction product of an amine compound, like an imidazole, and an epoxy resin. Such adducts are known to initiate and accelerate the cure of epoxy resins (Heise, M. S.; Martin, G. C. *Macromolecules,* 1989, 22 99-104; Heise, M. S.; Martin, G. C. *J. Poly. Sci.: Part C: Polym. Lett.* 1988, 26, 153-157; Barton, J. M; Shepherd, P. M.; *Die Makromolekular Chemie* 1975 176, 919-930). One drawback of these however is that they are so effective as curatives they cannot be used directly into a 1-part adhesive because once added, they would start to kick-off the cure in a relative short period of time. What one would see therefore is a slow increase in the viscosity of the composition, while one is attempting to make the adhesive and its film, as the hardener continues to accelerate the ring-opening polymerization of the epoxy moieties. This phenomenon is most commonly referred to as reduced workable lifetime, in other words, the time available to assemble the adhesive and make the film was dramatically reduced because of premature hardening. Therefore, to stop this from happening, one usually does not use amine-epoxy adducts themselves as hardeners, but instead what is typically done is to encapsulate or coat the amine-epoxy adduct with a protective shell of material that sequesters the amine-epoxy adduct from the adhesive environment. Once incorporated into the adhesive, the amine-epoxy adduct is released from its protective shell through the application of heat and/or pressure. Such latent hardeners described here are commonly called to as a core-shell latent hardener, where the core in this case is an amine-epoxy adduct and the shell is the protective shell.

There is one significant trade-off often encountered with core-shell latent hardeners, which is the cure speed is often slowed and the cure temperature often increased because of the inclusion of a protective shell, which must be broken or rendered permeable in order to allow the core material to be released into the adhesive environment or matrix. Without being bound by any particular theory, it is well known that as one increases the barrier properties of the shell material using such means, like increasing the thickness of the shell, cross-linking density, or $T_g$ of the shell, or by increasing the degree of incompatibility between the shell and the core material or the adhesive matrix, it takes more energy to release the amine-epoxy adduct into the adhesive environment. What one has therefore is a hardener that when formulated into a 1-part adhesive has the desired property of increased shelf life stability, but at the expense of a lower curing temperature and a reduction of cure speed. Therefore, it continues to be a constant balance to prepare a core-shell latent hardener that has just enough of a protective shell to protect the core material at normal storage conditions, but not too much as to slow down the cure speed of the adhesive. Also, the release of the core material may be triggered at a reasonably low temperature and completed within a narrow temperature range.

One of the most frequently used core-shell latent hardeners are those comprised of core-shell materials, as described in U.S. Pat. Nos. 4,833,226, 5,219,956, US 2006/0128835, US 2007/0010636, US 2007/0055039, US 2007/0244268, EP 1,557,438, EP 1,731,545, EP 1,852, 452, and EP 1,980,580. The hardeners described here are obtained, first by the synthesis of a lump of core material, which is then pulverized into micro-sized particles that are irregular in shape. The core material is the reaction product of an amine compound and an epoxy resin and said core material functions as a hardener for epoxy compositions, such as that found in adhesives and coatings. To improve the storage stability of the core material and prevent premature curing, it is encapsulated with a shell of a material that is impervious to components of the epoxy composition, such as solvent, diluent, low molecular weight epoxides and additives. To accomplish this, the pulverized solid is added to a mixture of polyfunctional isocyanate, an active hydrogen compound, like water, and an epoxy resin. The chemistry of said encapsulation procedure relies on the cross-linking reactions and/or hydrolysis of the polyisocyanate compound to form a cross-linked shell coating around the particles. Typical cross-linking structures of the shell include, but are not limited to, urea, urethane, carbamate, biuret, allophanate, etc. However, the crosslinking reactions take places randomly without discrimination in the continuous phase and at the interface. It is highly likely that some core particles are not fully encapsulated, while unwanted byproducts such as crosslinked polyurea particles are produced in the continuous phase. Moreover, the core particles prepared by this process are of irregular shape with a very broad distribution of shape and particle size, the uniformity of the thickness and crosslinking density of the shell formed thereon is very poor. As a result, the encapsulated hardener particles typically show a very broad distribution of release property and the 1-part adhesive formulated with this type of hardener capsules often shows poor shelf-life stability and a sluggish curing profile or a high curing temperature.

There is another group of inventions, namely EP 459,745, EP 552,976, U.S. Pat. Nos. 5,357,008, 5,480,957, 5,548,058, 5,554,714, 5,561,204, 5,567,792, and 5,591,814, that also describe core shell latent hardeners, which unlike those above are spherical in shape. The core material is obtained as a spherical particle and is synthesized from the reaction of an amine with an active hydrogen atom (e.g., imidazole) and an epoxy resin, in an organic medium and in the presence of a dispersant. The amine, epoxy resin, and dispersant are soluble in the organic medium, while the reaction product, the core material, is not, and as a result the core particle precipitates out from solution as a stable dispersion with a relatively narrow size distribution. The most important factor to make a stable dispersion of desirable particle size with a narrow size distribution is the nature of the dispersant and the inventors show examples that use dispersants from the class of graft of polyacrylates, polyacrylamides, polyvinyl acetates, polyethylene oxides, polystyrenes, and polyvinyl chlorides. Once isolated, the spherical core material is encapsulated with an isocyanate to prepare a spherical core-shell latent hardener.

One disadvantage of the aforementioned latent hardeners is the need of the shell material to be free of defects, such as such as holes, voids, thin areas, or areas comprised of insufficient cross-link density. These defects would enable the core to escape from the protective shell prematurely, either during processing or storage of the finished article. Either way, this premature release of core from the encapsulated latent hardener would show up as a loss of storage stability and shelf-life (in the case of a 1-part epoxy adhesive). This deficiency; however, can be overcome by the application of additional and successive layers of the shell material over the preexisting shell, thus filling in and coating the defects with an additional layers shell material.

Another limitation of the prior art is that in an attempt to make the protective shell more impervious and thereby improving its barrier properties, the compatibility of the shell with the surrounding epoxy composition was neglected. The prior art teaches encapsulation in the presence of an isocyanate, and optionally water and additional epoxy. What one then obtains is a shell comprised of a cross-linked polyurethane and optionally a polyurea. When formulated into an epoxy adhesive, the now hard and highly cross-linked shell could have poor capability with the surrounding epoxy. An example of this would be a mismatch of surface tensions between the surface of the shell and the epoxy; which would show up as a dewetting phenomenon in which the epoxy fails to adequately wet and spread over the surface of the shell material. As a consequence therefore one would see that after curing, the adhesive would contain voids and regions of inhomogeneous curing, both of which would lead to a reduction of adhesive strength.

There remains a need for core-shell latent hardeners with improved barrier properties to prevent premature cure. Additionally, there is a need of encapsulated latent hardeners with improved epoxy compatibility.

SUMMARY OF THE INVENTION

This invention relates to latent hardeners or catalysts for thermosets such as epoxy resins and, more particularly, to latent hardeners or catalysts comprised of a core material that is encapsulated or coated with two or more shell materials. The core material, which is a curative for epoxy resins, is further comprised of the reaction product of an amine (e.g., imidazoles, piperazines, primary aliphatic amines, and secondary aliphatic amines) and an epoxy resin. In one embodiment, the core material is synthesized in an organic medium and in the presence of a dispersant which is the reaction product of carboxyl terminated poly(butadiene-co-acrylonitrile) (CTBN) and an epoxy resin. In one embodiment, the reaction product of a CTBN and an epoxy resin is capable of providing a stable dispersion of spherical-shaped core particles with a narrow size distribution. In another embodiment near 100% conversion is obtained by using a slight excess of epoxy. In another embodiment, the spherical-shaped core particles are encapsulated by reacting with a multi-functional isocyanate or thioisocyanate. Optionally, an epoxy resin is added at the same time as the isocyanate to build up the thickness of the encapsulated shell. In still another embodiment, once formed, the core material is fully encapsulated with two or more shell materials that are applied in a stepwise manner using a multi-functional isocyanate, or a mixture of isocyanate and multi-functional epoxy resin, or a mixture of an isocyanate and epoxy compatible material, such as CTBN or polyacrylate modified epoxy, or a mixture of an isocyanate, multi-functional epoxy, and an epoxy compatible material. Curable compositions prepared using the particles have excellent storage stability and improved curing properties.

One aspect of this disclosure relates to an improvement to the barrier properties and solvent resistance of a latent hardener or catalyst.

Another aspect of this disclosure relates to an improvement of barrier properties and solvent resistance of a latent hardener or catalyst.

Another aspect of this disclosure relates to an improvement of compatibility of the latent hardener or catalyst with an epoxy resin or composition.

Another aspect of this disclosure relates to a latent hardener or catalyst of a spherical-shape and which is fully encapsulated.

Another aspect of this disclosure relates to a latent hardener or catalyst that releases the core material at the desired temperature, pressure, or combination of both.

Another aspect of this disclosure relates to a latent core-shell latent hardener or catalyst, wherein the hardener or catalyst is comprised of a stable dispersion of spherical-shaped particles.

Another aspect of this disclosure relates to a process of making spherical-shaped core particles using a dispersant, wherein said dispersant is the reaction product (adduct) of a carboxyl-terminated butadiene-acrylonitrile rubber (CTBN) and an epoxy resin.

Another aspect of this disclosure relates to a curing agent comprised of an amine compound, an epoxy resin, and a dispersant, wherein said dispersant is the adduct of CTBN and an epoxy resin.

Another aspect of this disclosure relates to a process for making the curing agent.

Another aspect of this disclosure relates to a masterbatch that is comprised of the curing agent.

Another aspect of this disclosure relates to an electronic device or a flat panel display comprising the composition that is comprised of the curing agent disclosed herein. For example a common method that is used to connect the driver integrated circuit (IC) to the electronic device or flat panel display is through the use of either a chip-on-glass (COG) or chip-on-film (COF). In the constructions of the COG and COF, anisotropic conducing film adhesives (ACF) and non-conducting film adhesives (NCF) are typically used to attach the COG or COF to the driver IC and it is the curing agent that enables the adhesives to cure and produce a permanent bond between the components. Accordingly, in one embodiment, the integrated circuit chip or other electronic component is attached using an epoxy adhesive containing the curing agent described herein.

Another aspect of this disclosure relates to a composition containing the curing agent, where the composition is an adhesive, conducting adhesive, composite, molding compound, anisotropic conducting film (ACF) adhesive, non-random array ACF, non-conductive adhesive film (NCF), coating, encapsulant, underfill material, lead or free solder.

Another aspect of this disclosure relates to a circuit board comprising an epoxy adhesive composition comprised of the curing agent that is disclosed herein. Traditionally, the electronic components, such as resistor, capacitor, and IC are assembled to the circuit board through a soldering process. This process requires high temperature and generates waste. However, an ACF, NCF or conductive adhesive containing the disclosed curing agent provides an alternative method to mount the electronic components on the circuit board without the use to high temperatures, waste, and toxic heavy metals. In this application, ACF and NCF provide the electrical contact and secure the component to the board.

Another aspect of this disclosure relates to an electronic device or display which is assembled using an epoxy adhesive composition that contains the curing agent disclosed herein.

Another aspect of this disclosure relates to a flip chip comprising the adhesive composition containing the curing agent disclosed herein. Traditionally a flip chip is a chip that mounted to the substrate in two steps. First, the chip is bonded to the substrate through soldering or eutectic bonding. Underfill material, typically in liquid form, is then filled in the gap and cured between the chip and the substrate. Replacing the soldering or eutectic bonding process with an ACF or NCF containing the disclosed curing agent is an alternative method to accomplish the first step. Not only does the adhesive approach provided advantages encountered with circuit boards, but the ACF and NCF also function as the underfill material to fill the gap between the chip and the substrate thereby accomplishing the process in a single step, where two were used before.

Another aspect of this disclosure relates to an electronic device or display where the composition is cured, partially cured, or un-cured and is comprised of the curing agent.

Another aspect of this disclosure relates to a semiconductor device, such as a high definition LCD, Electronic Paper (ePaper), mini projectors, and cell phones that are comprised of flat panel displays, electronic devices, circuit boards, and flip chips in which an epoxy adhesive containing the curing agent disclosed herein is used as described above.

Another aspect of this disclosure is a fixed array ACF, where the fixed array ACF is an ACF wherein the gold particles are dispersed in the adhesive film in a predetermined pattern, such as that described in Trillion's patent application 2006/0280912 A1 wherein an epoxy adhesive containing the curing agent disclosed herein is used to construct the array.

Another aspect of this disclosure is a High $T_g$ 1-part molding compound comprising a protected phenolic compound as described in pending U.S. application Ser. No. 12/008,375 filed Jan. 10, 2008 which is herein incorporated by reference, where the protected phenolic compound comprises an aryl glycidyl carbonate moiety, and the curing agent disclosed herein.

Still another aspect of this disclosure are 1-part composites, including prepreg composites and molding compounds, such as sheet molding compounds (SMC), bulk molding compounds (BMC), and dough molding compounds (DMC) wherein the curing agent is the curing agent disclosed herein.

Still another aspect of the disclosure is adhesives and coating applications, including solder mask and impregnation coatings in which the curing agent is the curing agent disclosed herein.

Another aspect of this disclosure employs epoxy resins containing the curing agent disclosed herein in assembly and packaging for semi-conductor applications such as described in Colclaser, Roy A.; "*Microelectronics Processing and Device Design*"; John Wiley & Sons, Publishers: New York, 1980; Chapter 8, page pp. 163-181.

Another aspect of this disclosure relates to the circuit board where the composition is cured, partially cured, or un-cured and is comprised of the curing agent disclosed herein.

Another aspect of this disclosure relates to a flip chip where the epoxy adhesive composition described herein is cured, partially cured, or un-cured and is comprised of the curing agent.

Another aspect of this disclosure relates to a semiconductor device comprising the composition containing the curing agent. Another aspect of this disclosure relates to a semiconductor device where the composition is cured, partially cured, or un-cured and is comprised of the curing agent.

Another aspect of this disclosure relates to a composition, where the composition is a 1-part adhesive composition having a substantially long shelf-life at storage conditions and the composition is reactive at either the curing temperature or the molding temperature, and the composition contains the curing agent disclosed herein.

Another aspect of this disclosure relates to a composition containing the curing agent, where after cure the composition shows adhesion at interfaces, low shrinkage on cure, and low coefficient of thermal expansion (CTE).

Another aspect of this disclosure relates to a composition containing the curing agent, where the composition is a matrix for a composite material or molding compound.

DETAILED DESCRIPTION OF THE INVENTION

Figure 1:
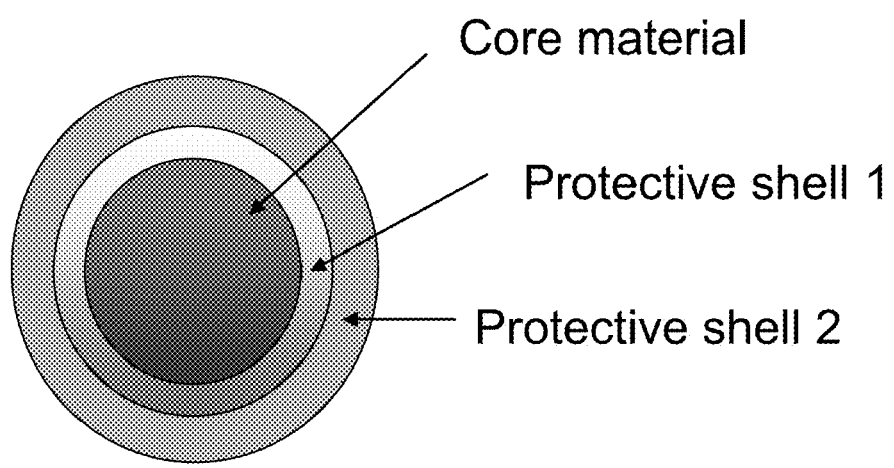
FIG. 1 is a drawing showing a core material encapsulated with two protective shell materials. In the case for improved latent hardener compatibility the composition of protective shell 2 is selected such that is comprised of an epoxy compatible material, while the composition of shell 1 is selected based only on its barrier properties.

In accordance with one embodiment, the curing agent is an adduct of: (i) an amine, (ii) an epoxy compound, and (iii) an adduct of an elastomer and an epoxy resin. The elastomer/epoxy resin adduct functions as an reactive dispersant enabling the formation of a dispersion of spherical un-encapsulated particles in the reaction medium.

Another aspect of the invention is a method for the preparation of fine spherical core particles of a curing agent that comprises reacting an amine compound with an epoxy/elastomer adduct followed by an epoxy compound, in the presence of a continuous phase at elevated temperatures with agitation, and recovering fine spherical particles formed from the reaction mixture solution. Optionally, the recovered particles may be filtered to remove aggregated particles and classified by methods such as gravity fractionation, filtration, sedimentation, field flow fractionation, and field flow classification to remove small satellite particles. The continuous phase is an organic solvent or solvent mixture comprised of either a solvent capable of dissolving the amine compound, the epoxy compound and the epoxy/elastomer adduct but incapable of dissolving the adduct formed from the three reactants or a mixture of a solvent and non-solvent, where the solvent is capable of dissolving the amine compound, the epoxy compound and the epoxy/elastomer adduct but incapable of dissolving the adduct particles formed from the three reactants or a mixture and the non-solvent is a non-solvent for the amine compound, the epoxy compound, the epoxy/elastomer adduct, and the adduct particles formed from the three reactants. The selection of the continuous phase affects the dispersion stability and the particle size and particle size distribution.

Yet another embodiment of the invention is a heat curable composition that comprises, as its major components, an epoxy composition and spherical particles of the curing agent. In this case, the spherical particles of the curing agent of this invention are not soluble or swellable in the epoxy composition. In one embodiment the particles have a melting flow temperature of at least about 50° C. and a particle diameter of 0.1 μm to 30 μm. The particles are incorporated in the adhesive in an amount of about 1 to 60 parts by weight per 100 parts by weight of the epoxy resin.

The present invention also includes a curing agent masterbatch for epoxy resins wherein the masterbatch comprises a liquid epoxy resin in which fine spherical particles of the curing agent are uniformly dispersed. In a particular embodiment, the particles have been reacted with 1 to 100 parts by weight of a polyfunctional isocyanate compound, and optionally with 1-100 parts by weight of an epoxy compound, based on 100 parts by weight of said particles. The particles are then allowed to react one or more additional times in successive steps with 1 to 100 parts by weight of a polyfunctional isocyanate compound, and optionally with 1-100 parts by weight of a multifunctional epoxy compound, and optionally with 1-100 parts by weight of an epoxy compatible material, based on 100 parts by weight of said particles.

The present invention further includes a method for preparation of a curing agent masterbatch for epoxy resin with comprises the step of dispersing spherical particles of the curing agent in an epoxy resin at a temperature below the melt flow temperature of said spherical particles.

Curing Agent Epoxy Plus Amine Compound

In the present invention the amine compounds and the epoxy compounds which can be employed in the preparation of the curing agent are selected based on its chemical structure which promotes the curing reaction by anionic polymerization, its melting point, and its compatibility with the epoxy resin which will be cured in a molten or plasticized viscoelastic state, its quick curability and its reactivity. The melting flow temperature is defined herein as the temperature at which the substance begins to flow as a molten fluid, as determined by the conventional methods. Examples of amine and epoxy compounds useful in certain embodiments of the invention are disclosed in EP 459,745, EP 552,976, U.S. Pat. Nos. 5,357,008 , 5,480,957, 5,548,058, 5,554,714, 5,561,204, 5,567,792, and 5,591,814, which are incorporated herein by reference.

Amine Compound

While any amine compound can be used, the selection of the amine will be based upon the nature of the epoxy compound. An amine is selected that reacts with the epoxy compound but enables the reaction without full polymerization. While it is possible to use substantially any amine compounds when reacting monofunctional epoxy compounds, when reacting polyfunctional epoxy compounds, an amine compound which has only one active hydrogen, i.e., a secondary amino group that contributes to the reaction of the epoxy group. Use of compounds having a tertiary amino group, i.e., having no active hydrogen, is also permitted. The following compounds are illustrative examples of amine compounds which can be combined with bifunctional bisphenol A diglycidyl ether: imidazoles represented by 2-methylimidazole and 2,4-dimethylimidazole, piperazines represented by N-methyl piperazine and N-hydroxylethyl-piperazine, anabasines represented by anabasine, pyrazoles represented by 3,5-dimethyl-pyrazole, purines represented by tetra-methylquanidine or purine, pyrazoles represented by pyrazole, and triazoles represented by 1,2,3-triazole, and the like.

Epoxy Compound

Examples of epoxy compounds are monofunctional epoxy compounds such as n-butyl glycidyl ether, styrene oxide and phenylglycidyl ether; bifunctional epoxy compounds such as bisphenol A diglycidyl ether, bisphenol F diglycidyl ether, bisphenol S diglycidyl ether and diglycidyl phthalate; trifunctional compounds such as triglycidyl isocyanurate, triglycidyl p-aminophenol; tetrafunctional compounds such as tetraglycidyl m-xylene diamine and tetraglycidyldiaminodiphenylmethane; and compounds having more functional groups such as cresol novolac polyglycidyl ether, phenol novolac polyglycidyl ether and so on. The selection of epoxy is also determined by the type of the amine compound to be combined. The epoxy compounds are also selected based upon the softening point of the adduct formed and the compatibility in a molten state with respect to the epoxy resin which is to be cured. Since the majority of the epoxy resins to be cured comprise bisphenol A diglycidyl ether, this compound is most typically used as the starting material for the preparation of an adduct. In one embodiment, epoxy compounds having an epoxy equivalent weight of, at most about 1,000, and preferably at most about 500 are typically employed.

Solvent

It is also important to select a solvent system which can dissolve the amine compounds and the epoxy compound as the starting materials but can precipitate the adduct in the form of particles without dissolution. Examples of solvents that can be used in certain embodiments of the present invention are methyl isobutyl ketone, methyl isopropyl ketone, methyl ethyl ketone, acetone, n-butylacetate, isobutyl acetate, ethyl acetate, methyl acetate, tetrahydrofuran, 1,4-dioxane, cellosolve, ethyleneglycol monoethyl ether, diethyleneglycol dimethyl ether, anisole, toluene, p-xylene, benzene, methylene chloride, chloroform, trichloroethylene, chlorobenzene and pyridine. These solvents can be used alone, or two or more solvents can be used together.

Non-Solvent

Additionally a non-solvent may need to be added to assist with forcing the amine compound to react with the epoxy functionalities of the dispersion stabilizer and epoxy resin. A non-solvent in the case is any solvent that does not dissolve either the amine compound, dispersion stabilizer, or epoxy resin. One possible class of compounds that can be used as non-solvents are linear or branched aliphatic compounds such as heptane, hexane, octane, iso-octane, petroleum ether, and the like. One example of a non-solvent in combination with a solvent is a mixture of heptane and MIBK. In addition to the above-mentioned solvent and non-solvent, a diluent or a weak solvent may be optionally used to widen the formulation or process window.

Dispersion Stabilizer or Dispersant

The dispersion stabilizer or dispersant enables a stable dispersion of the adduct particles in the reaction medium. Without such a dispersion stabilizer, the particles of the adduct formed may aggregate and precipitate out as a viscous mass during the reaction, and thus the desired fine spherical particles cannot be obtained. An optimum dispersant is important for the preparation of a stable dispersion with a narrow particle size distribution. Reactive dispersants are often more effective than non-reactive dispersants since desorption or migration of the dispersant away from the particle surface is less likely once it reacts with the particle phase. Elastomer/epoxy adducts are used as reactive dispersants in accordance to this invention. A suitable molecular weight range of the reactive dispersant is from about 1,000 to 300,000, preferably from about 2,000 to 100,000, and most preferably from about 3,000 to 10,000.

Epoxy/Elastomer Adducts as Reactive Dispersants

The epoxy/elastomer adduct itself generally includes about 1:5 to 5:1 parts of epoxy or other polymer to elastomer, and more preferably about 1:3 to 3:1 parts of epoxy to elastomer. More typically, the adduct includes at least about 5%, more typically at least about 12% and even more typically at least about 18% elastomer and also typically includes not greater than about 50%, even more typically no greater than about 40% and still more typically no greater than about 35% elastomer, although higher or lower percentages are possible. The elastomer suitable for the adduct may be functionalized at either the main chain or the side chain. Suitable functional groups include, but are not limited to, —COOH, —NH$_2$'— NH—, —OH, —SH, —CONH$_2$, —CONH—, —NH-CONH—, —NCO, —NCS, and oxirane or glycidyl group, etc. The elastomer optionally may be vulcanize-able or post-crosslink-able. Exemplary elastomers include, without limitation, natural rubber, styrene-butadiene rubber, polyisoprene, polyisobutylene, polybutadiene, isoprene-butadiene copolymer, neoprene, nitrile rubber, butadiene-acrylonitrile copolymer, butyl rubber, polysulfide elastomer, acrylic elastomer, acrylonitrile elastomers, silicone rubber, polysiloxanes, polyester rubber, diisocyanate-linked condensation elastomer, EPDM (ethylene-propylene diene rubbers), chlorosulphonated polyethylene, fluorinated hydrocarbons, thermoplastic elastomers such as (AB) and (ABA) type of block copolymers of styrene and butadiene or isoprene, and (AB)n type of multi-segment block copolymers of polyurethane or polyester, and the like. In the case that carboxyl-terminated butadiene-acrylonitrile (CTBN) is used as the functionalized elastomer, the preferable nitrile content is from 12-35% by weight, more preferably from 20-33% by weight.

Figure 5:
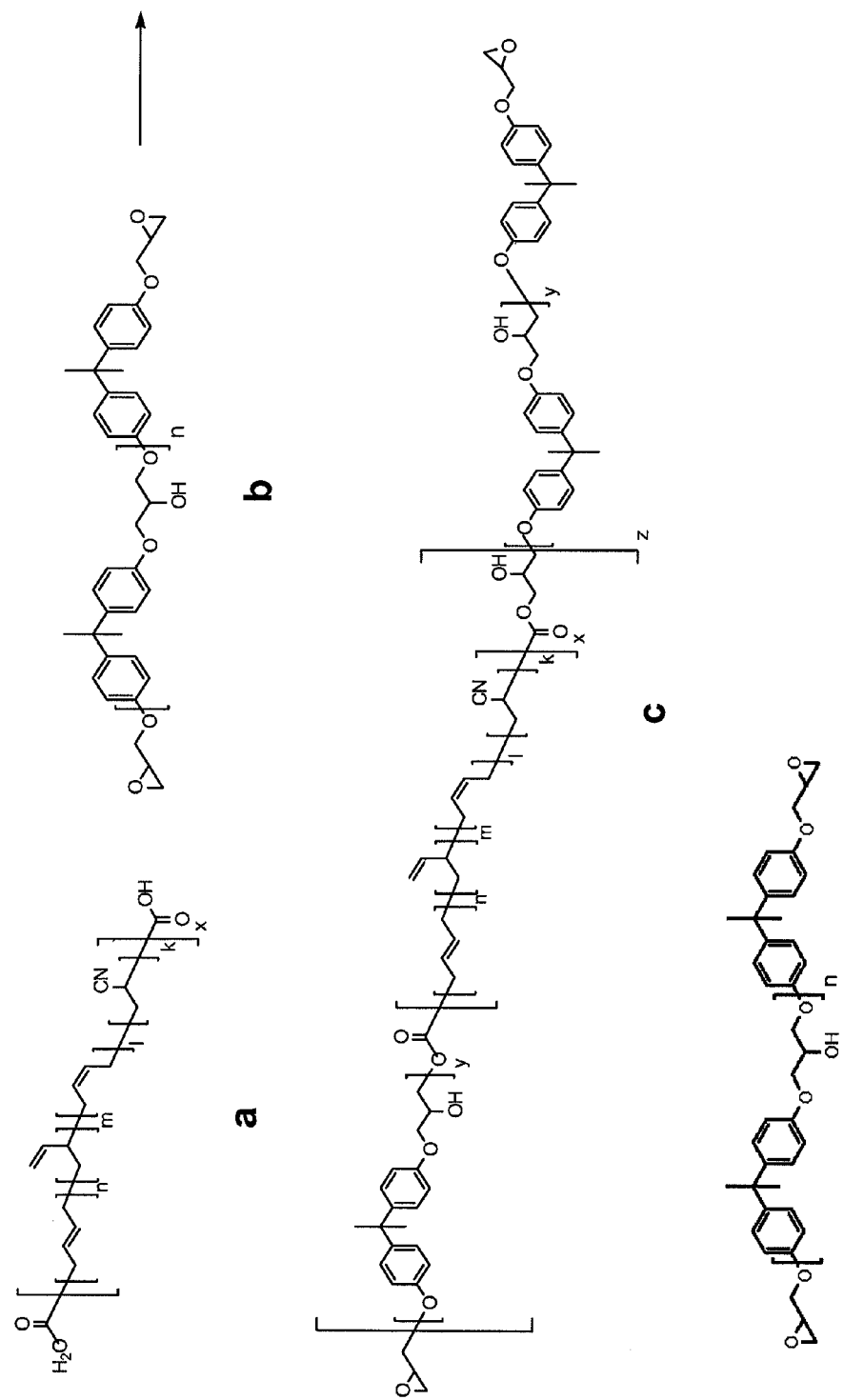
FIG. 5 is the chemical structure of a CTBN-epoxy adduct (c) where a hydroxyl-functional epoxy resin (b) such as that of CVC Thermoset Specialties HyPox RK84 is used in the synthesis along with CTBN (a). The residual unreacted epoxy resin (b) is removed prior to (c) being used as a dispersant.
Figure 6:
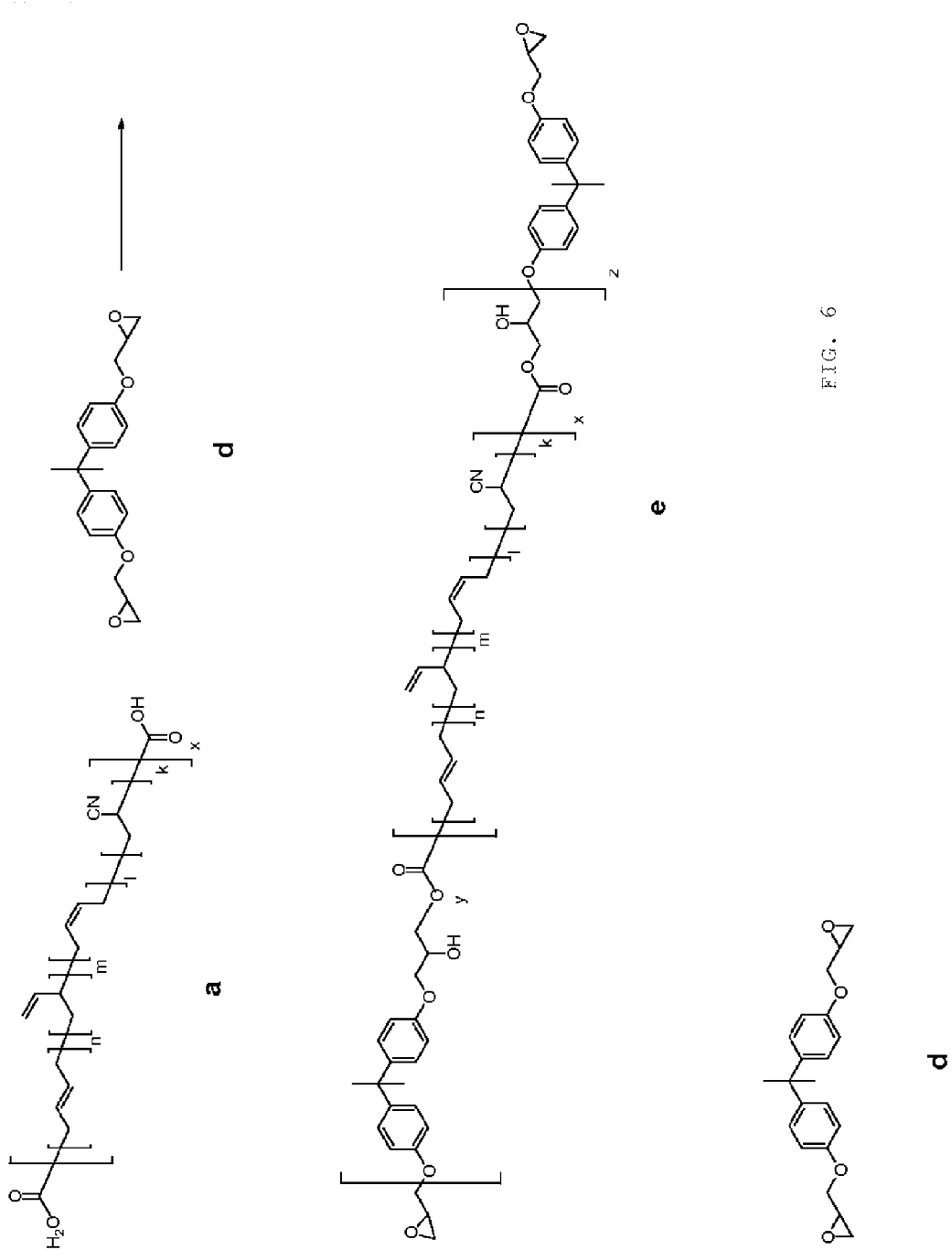
FIG. 6 is the chemical structure of a CTBN-epoxy adduct (e) where disglydicyl ether of bisphenol A (d) such as that of CVC Thermoset Specialties HyPox RA1340 is used in the synthesis, along with CTBN (a).

An example of a preferred epoxide-functionalized epoxy/elastomer adduct is sold in admixture with an epoxy resin under the trade name HyPox™ RK84 (FIG. 5), a bisphenol A epoxy resin modified with CTBN elastomer, and the trade name HyPox™ RA1340 (FIG. 6), an epoxy phenol novolac resin modified with CTBN elastomer, both commercially available from CVC Thermoset Specialties, Moorestown, N.J. In addition to bisphenol A epoxy resins, other epoxy resins can be used to prepare the epoxy/elastomer adduct, such as n-butyl glycidyl ether, styrene oxide and phenylglycidyl ether; bifunctional epoxy compounds such as bisphenol A diglycidyl ether, bisphenol F diglycidyl ether, bisphenol S diglycidyl ether and diglycidyl phthalate; trifunctional compounds such as triglycidyl isocyanurate, triglycidyl p-aminophenol; tetrafunctional compounds such as tetraglycidyl m-xylene diamine and tetraglycidyldiaminodiphenylmethane; and compounds having more functional groups such as cresol novolac polyglycidyl ether, phenol novolac polyglycidyl ether and so on. Examples of additional or alternative epoxy/elastomer and other adducts suitable for use in the present invention are disclosed in U.S. Pat. No. 6,846,559 and U.S. Patent Publication 2004/0204551 to Czaplicki, Michael both of which are incorporated herein by reference.

Amine Compound Plus Reactive Dispersant

To prepare the curing agent, in one non-limiting process, the selected amine compound and the epoxide-functionalized reactive dispersant are first allowed to react to ensure the dispersant is fully incorporated. The reactive dispersant is dissolved in a selected solvent system and allowed to react using a combination of heating and stirring from about 2 min to about 3 h, preferably from about 4 min to about 2 h, and most preferably from about 5 min to about 1 h. Thus, the reaction temperature which can be employed in the present invention is typically 40° C. to 90° C., preferably 50° C. to 80° C., and the concentration of the starting materials, i.e. the amine compound and the epoxide-functionalized reactive dispersant, is typically about 2 to 40% by weight, preferably about 5 to 30% by weight. The amount of reactive dispersant is from about 1 to 70% (w/w) based on the combined weights of the reactive dispersant and amine compound, preferably from about 5 to 50% (w/w) based on the combined weights of the reactive dispersant and amine compound and most preferably from about 9 to 35% (w/w) based on the combined weights of the reactive dispersant and amine compound. In the special case where the epoxide-functionalized reactive dispersant contains a residual epoxy compound that is not bonded to the elastomer, such as in FIGS. 5 and 6, an additional purification step is undertaken which consists of removing the unreacted epoxy compound from said reactive dispersant. This purification step is especially important to avoid the formation of aggregates and lumps of solid material after the addition of the epoxy compound (see below).

Epoxy Compatible Material

The epoxy compatible material is any epoxy-functional material that contains a functional group or groups that are compatible with an epoxy resin. One example are the epoxide-functionalized epoxy/elastomer adducts that are sold as admixtures with an epoxy resin, available commercially under the trade name HyPox™ RK84 (FIG. 5) and the trade name HyPox RA1340 (FIG. 6), from CVC Thermoset Specialties, Moorestown, N.J. Said HyPox elastomers contain the epoxy compatibilizing monomer acrylonitrile. Other examples would include, but are not limited to, epoxy-functional polyacrylates that would contain epoxy compatible co-monomers, like acrylonitrile and methyl methacrylate.

Amine Compound Plus Epoxide-Functionalized Reactive Dispersant Plus Epoxy Compound, Formation of the Un-Encapsulated Particles.

After the amine compound has been allowed to react with the epoxide-functionalized dispersant, the formation of the un-encapsulated latent hardener particles begins with the addition of the epoxy compound. A solution of the epoxy compound is slowly added to the stirred heated solution of the amine compound-dispersion stabilizer solution over the course from about 5 min to 6 h, preferably from about 10 min to 4 h, and most preferably from about 15 min to 2 h, using an apparatus that allows for a constant uninterrupted addition of epoxy resin solution, such as a syringe pump or peristaltic pump or the like. The amount of epoxy compound is from about 10 to 90% (w/w) based on the combined weights of the amine compound, reactive dispersant, and epoxy compound, preferably from about 30 to 85% (w/w) based on the combined weights of the amine compound, reactive dispersant, and epoxy compound, and most preferably from about 50 to 80% (w/w) based on the combined weights of the amine compound, reactive dispersant, and epoxy compound. In one example, a solution of the reactive dispersant and the amine is agitated, while heating, under an inert atmosphere and after a predetermined time, a solution of epoxy compound is added over a predetermined time. The originally clear solution will become opaque as the epoxy compound begins to react. As the reaction progresses, the opaqueness of the reaction system gradually increases, with a characteristic milky white turbid dispersion eventually occurring.

When the reaction temperature and the concentration of the starting materials are too high, aggregates may easily form even in the presence of a suitable amount of the reactive dispersant. Thus, the reaction temperature which can be employed in the present invention is typically 40° C. to 90° C., preferably 50° C. to 80° C., and the concentration of the starting materials, i.e. the amine compound, the reactive dispersant, and epoxy compound, is typically 2 to 40% by weight, preferably 5 to 30% by weight. Generally, the particle size of the adduct increases with increased concentrations of the starting materials but decreases with increased concentrations of the reactive dispersant.

Encapsulation

The particles are subsequently encapsulated, with each layer of encapsulate or protective shell applied over the particle in two or more successive steps. Various known methods for encapsulating spherical curing agents may be used in this invention. In one embodiment, the adduct particles may be reacted with an encapsulation agent to form two or more protective shells, where said encapsulating agent is comprised of a polyfunctional isocyanate compound or a mixture of polyfunctional isocyanate compounds and multifunctional epoxy compounds or a mixture of polyfunctional isocyanate and epoxy compatible compound (e.g., acrylonitrile), or a mixture of a polyfunctional isocyanate, epoxy compounds, and epoxy compatible compound. Suitable polyfunctional isocyanate compounds include the mononuclear and polynuclear species of toluene diisocyanate, methylene diphenyl diisocyanate, hydrogenated methylene diphenyl diisocyanate, 1,5-naphthalene diisocyanate, isophorone diisocyanate, hexamethylene diisocyanate, xylylene diisocyanate, hydrogenated xylylene diisocyanate, tetramethylxylene diisocyanate, 1,3,6-hexamethylene triisocyanate, lysine diisocyanate, triphenylethane triisocyanate, polyfunctional isocyanate compounds formed by addition of such compounds and other active hydrogen-containing compound, and any mixtures thereof.

Representative examples of multifunctional epoxies include methylene bisglycidyl aniline, HELOXY™ Modifier 48 (a product of Hexion Specialty Chemicals), Toagosei GP-301 graft polymethylmethacrylate-g-epoxy modified acrylate polymer, and a multi-functional epoxy containing acrylonitrile (epoxy compatible co-monomer) but other multifunctional epoxies should also work.

The amount of the encapsulation agent employed to encapsulate the un-encapsulated particles affects the storage stability and the curability of a curing agent masterbatch. With the same particles of the addition product, increased amounts of the encapsulation agent improve the storage stability, but lower the curability. Thus, for adduct particles having a diameter of about 0.1 micron to 30 micron, the encapsulation agent is employed in ratio from about 50:50 to 95:5 (w/w) core particles to encapsulation agent, preferably from about 60:40 to 90:10 (w/w) core particles to encapsulation agent, and most preferably in a ratio from about 70:30 to 90:10 (w/w) core particles to encapsulation agent. Additionally, when the encapsulation agent is a mixture of isocyanate compounds and epoxy compounds or isocyanate compounds and epoxy compatible compounds, the amount of epoxy compound is used in a ratio from about 1:99 to 99:1 (w/w) isocyanate compounds to epoxy compounds, preferably from about 60:40 to 99:1 (w/w) isocyanate compounds to epoxy compounds, and most preferably in a ratio from about 80:20 and 99:1 (w/w) isocyanate compounds to epoxy compounds. Additionally, when the encapsulation agent is a mixture of isocyanate compounds, epoxy compounds, and epoxy compatible compounds, the amount of epoxy compound is used in a ratio from about 1:99 to 99:1 (w/w) isocyanate compounds to epoxy compounds, preferably from about 60:40 to 99:1 (w/w) isocyanate compounds to epoxy compounds plus epoxy compatible compounds, and most preferably in a ratio from about 80:20 and 99:1 (w/w) isocyanate compounds to epoxy compounds. Thus, the compromise between storage stability and curability varies depending on the size of the adduct particle, with smaller particle sizes requiring increased amounts of shell forming material such as polyfunctional isocyanate to achieve the same release or barrier properties.

In one embodiment, when the particle forming reaction is completed, the un-encapsulated particles are isolated from the reaction medium by filtration and then washed with fresh solvent. The particles are then subsequently encapsulated.

Masterbatch

In general, to form the masterbatch, the encapsulated particles are uniformly dispersed in an epoxy resin in a range from about 5 to 90% (w/w) based on the combined weights of the particles and epoxy resin, preferably in the range of about 15 to 80% (w/w) based on the combined weights of the particles and liquid epoxy compound, and most preferably in the range of about 20 to 70% (w/w) based on the combined weights of the particles and liquid epoxy compound.

In one embodiment, the epoxy resin can be one or more epoxy resins of bisphenol A, bisphenol F, novolac epoxies, and the like.

In one embodiment, to avoid the formation of secondary particles, the encapsulated particles are mechanically dispersed in the epoxy resin as primary particles, for example, by blending with a three roll mill.

In another embodiment, after the encapsulation process is completed, heating and stirring are stopped and an epoxy resin is added to the dispersion. The mixture is again stirred, enough to distribute the epoxy resin equally in the dispersion. The solvent is then removed, using vacuum distillation, or the like, such that the total solid content is about 60 to 100% (w/w), preferably about 70 to 100% (w/w), and most preferably about 80 to 100% (w/w). The particles are then dispersed further in the epoxy resin using techniques known to those of ordinary skill in the art, such as a three-roll mill, or the like.

In yet another embodiment, when the reaction is completed, the solvent is removed using vacuum distillation to 100% (w/w) solids content. The solid particles are then added to an epoxy resin and the particles dispersed further in epoxy resin using techniques known to those of ordinary skill in the art, such as a three-roll mill, or the like.

In still yet another embodiment, when the reaction is completed, the particles are separated by filtering the dispersion of the particles. Fresh solvent is used to wash off unreacted starting material adhered to the surface of the particles. An epoxy resin is then added to the solid particles and the mixture dispersed further using techniques known to those of ordinary skill in the art, such as a three-roll mill, or the like.

The adhesive compositions disclosed herein are potentially useful in various applications including in a conducting adhesive, composite, molding compound, anisotropic conducting film (ACF) adhesive, non-random array ACF, non-conductive adhesive film (NCF), coating, encapsulant, underfill material, lead-free solder, etc.

Having described the invention in detail, the invention will be illustrated by the following non-limiting examples:

EXAMPLES

Examples for the Formation of the Un-Encapsulated Core Particles

Example 1

Synthesis of Un-Encapsulated Core Particles from 2-methylimidazole, DGEBA, and HyPox™ RK 84
(1)

Commercial material HyPox RK84 [a commercial material of CVC Thermoset Specialties and mixture of a bisphenol A epoxy resin and its adduct with CTBN (FIG. 5)] was used as the dispersion stabilizer. A three-necked round bottom flask, equipped with a PTFE fluoropolymer half moon-shaped overhead stirrer, a reflux condenser, an addition funnel, and an argon gas inlet was charged with 0.93 g of the CTBN-epoxy adduct, 1.64 g (0.02 mole) of 2-methylimidazole and 48 g of 4-methyl-2-pentanone (MIBK). The reactor was placed in an 80° C. bath and purged with argon. After 1 h, a solution of 3.39 g (0.019 equivalent weight) DER™ 332 (a product of Dow Chemical) and 3.4 g of MIBK was added dropwise over the course of 20 min, after which the reaction was allowed to stir at 300 rpm for 6 hr under an argon atmosphere. A white milky dispersion was formed. The dispersion was discharged from the reactor, centrifuged, washed with MIBK, and evaporated to dryness to afford 3.6 g (60.4% yield) of product. A small drop of the dispersion was diluted, coated on glass slide and dried in vacuum at room temperature. The dried sample was sputtered with a thin layer of gold and the scanning electron micrograph of this taken using a Hitachi S-2460N scanning electron microscope.

Example 2

Synthesis of Un-Encapsulated Core Particles from 2-methylimidazole, DGEBA, and HyPox™ RK 84
(2)

A CTBN-epoxy adduct that was isolated from CVC Thermoset Specialties HyPox™ RK84 was used as the dispersion stabilizer. The adduct was obtained by dissolving the material in methyl ethyl ketone, followed by precipitation with methanol, and repeating the process two more times. The un-encapsulated core particles 2 were synthesized from 0.51 g of the CTBN-epoxy adduct, 1.63 g (0.02 mole) of 2-methylimidazole, 3.51 g (0.02 equivalent weight) DER™ 332 and 51 g of MIBK using the procedure of Example 1 to afford 4.4 g (78% yield) of particles.

Example 3

Synthesis of Un-Encapsulated Core Particles from 2-methylimidazole, DGEBA, and HyPox™ RA 1340
(3)

Commercial material HyPox RA1340 [a commercial material of CVC Thermoset Specialties and mixture of diglycidyl ether of bisphenol A and its adduct with CTBN (FIG. 6)] was used as the dispersion stabilizer. The microcapsule core 3 was synthesized from 1.15 g of the aforementioned CTBN-epoxy adduct, 1.64 g (0.02 mole) of 2-methylimidazole, 2.87 g (0.0164 equivalent weight) DER™ 332 and 51 g of MIBK using the procedure of Example 1 to afford 1.2 g (21.2% yield) of particles.

Example 4

Synthesis of Un-Encapsulated Core Particles from 2-methylimidazole, DGEBA, and HyPox™ RA 1340
(4)

A CTBN-epoxy adduct isolated from CVC Thermoset Specialties HyPox™ RA 1340 was used as the dispersion stabilizer. The adduct was obtained by first dissolving the material in methyl ethyl ketone, followed by precipitation with methanol, and repeating the process two more times. The un-encapsulated core particles 4 were synthesized from 0.53 g of the CTBN-adduct, 1.65 g (0.02 mole) of 2-methylimidazole, 3.5 g (0.02 equivalent weight) DER™ 332, and 51 g of MIBK using the procedure as described in Example 1 to afford 2.6 g (45.9% yield) of particles.

Example 5

Synthesis of Un-Encapsulated Core Particles from 2-ethyl-4-methylimidazole, DGEBA, and HyPox™ RK 84 (5)

The un-encapsulated core particles 5 were synthesized from 0.57 g of the CTBN-epoxy adduct of Example 2, 2.20 g (0.02 mole) of 2-ethyl-4-methylimidazole, 3.5 g (0.02 equivalent weight) DER™ 332, and 63 g of MIBK using the procedure of Example 1 to afford 0.7 g (11.2% yield) of particles.

Example 6

Synthesis of Un-Encapsulated Core Particles from 2-methylimidazole, DGEBA, and HyPox™ RA 1340
(6)

The un-encapsulated core particles 6 were synthesized from 0.26 g of the CTBN-epoxy adduct of Example 4, 1.64 g (0.02 mole) of 2-methylimidazole, 3.5 g (0.02 equivalent weight) DER™ 332, and 50 g of MIBK using the procedure of Example 1 to afford 1.6 g (26.9% yield) of particles.

Example 7

Synthesis of Un-Encapsulated Core Particles from 2-ethyl-4-methylimidazole, DGEBA, and HyPox™ RK 84 (7)

The un-encapsulated core particles 7 were synthesized from 0.57 g of the CTBN-epoxy adduct of Example 2, 2.20 g (0.02 mole) of 2-ethyl-4-methylimidazole, 3.5 g (0.02 equivalent weight) DER™ 332 and 56 g of MIBK using the procedure of Example 1 and the reaction was allowed to stir at 300 rpm for 16.5 h under an argon atmosphere to afford 2.5 g (40% yield) of particles.

Example 8

Synthesis of Un-Encapsulated Core Particles from 2-methylimidazole, DGEBA, and HyPox™ RK 84 (8)

The microcapsule core 8 was synthesized from 0.52 g of the CTBN-epoxy adduct of Example 2, 1.64 g (0.02 mole) of 2-methylimidazole, 3.5 g (0.02 equivalent weight) DER™ 332, and 51 g of MIBK using the procedure of Example 1. The reaction was allowed to stir at 300 rpm for 16 h under an argon atmosphere to afford 4.0 g (71% yield) of particles.

Example 9

Synthesis of Un-Encapsulated Core Particles from 2-methylimidazole, DGEBA, and HyPox™ RK 84 (9)

The un-encapsulated core particles 9 were synthesized from 0.52 g of the CTBN-epoxy adduct of Example 2, 1.64 g (0.02 mole) of 2-methylimidazole, 3.5 g (0.02 equivalent weight) DER™ 332, and 52 g of MIBK using the procedure of Example 1. The reaction was allowed to stir at 1000 rpm for 6 h under an argon atmosphere to afford 4.18 g (74% yield) of particles.

Example 10

Synthesis of Un-Encapsulated Core Particles from 2-methylimidazole, DGEBA, and HyPox™ RK 84 (10)

The un-encapsulated core particles 10 were synthesized from 0.52 g of the CTBN-epoxy adduct of Example 2, 1.64 g (0.02 mole) of 2-methylimidazole and 37.3 g of 4-methyl-2-pentanone (MIBK). The reactor was placed in an 80° C. bath and purged with argon. After 1 h, a solution of 3.5 g (0.02 equivalent weight) DER™ 332 (a product of Dow Chemical) and 3.5 g of MIBK was added dropwise over the course of 15 min, after which the reaction was allowed to stir at 1000 rpm for 1 h under an argon atmosphere. After this, 10 g of heptane was added dropwise over the course of 1 h. The reaction was allowed to stir at 1000 rpm for another 4 h. A white milky dispersion was formed. The dispersion was discharged, centrifuged, washed with MIBK, and evaporated to dryness to afford 2.1 g (37% yield) of dried particles.

Example 11

Synthesis of Un-Encapsulated Core Particles from 2-methylimidazole, DGEBA, and HyPox™ RK 84 (11)

The un-encapsulated core particles 11 were synthesized from 0.52 g of the CTBN-epoxy adduct of Example 2, 1.64 g (0.02 mole) of 2-methylimidazole, and 37.3 g of 4-methyl-2-pentanone (MIBK). The reactor was placed in an 80° C. bath and purged with argon. After 1 h, a solution of 3.5 g (0.02 equivalent weight) DER™ 332 (a product of Dow Chemical) and 3.5 g of MIBK was added dropwise over the course of 15 min, after which the reaction was allowed to stir at 1000 rpm for 1 h under an argon atmosphere, after which 3 g of heptane was added drop wise over the course of 1 h. The reaction was allowed to stir at 1000 rpm for 4 h. A white milky dispersion was formed. The dispersion was discharged, centrifuged, washed with MIBK, and evaporated to dryness to afford 3.0 g (53% yield) of dried particles.

Example 12

Synthesis of Un-Encapsulated Core Particles from 2-methylimidazole, DGEBA, and HyPox™ RK 84 (12)

The un-encapsulated core particles 12 were synthesized from 1.05 g of the CTBN-epoxy adduct of Example 2, 1.64 g (0.02 mole) of 2-methylimidazole, 3.5 g (0.02 equivalent weight) DER™ 332, and 51 g of MIBK using the procedure of Example 1. The reaction was allowed to stir at 1000 rpm for 6 h to afford 4.4 g (71% yield) of particles.

Example 13

Synthesis of Un-Encapsulated Core Particles from 2-methylimidazole, DGEBA, and HyPox™ RK 84 (13)

A three-necked round bottom flask, equipped with a PTFE fluoropolymer half moon-shaped overhead stirrer, a reflux condenser, an addition funnel, and an argon gas inlet. The flask was charged with 0.52 g of the CTBN-epoxy adduct of Example 2, 1.64 g (0.02 mole) of 2-methylimidazole, 5.1 g of heptane and 42.3 g of 4-methyl-2-pentanone (MIBK). The reaction flask was placed in an 80° C. bath and purged with argon. After 1 h, a solution of 3.5 g (0.02 equivalent weight) DER™ 332 (a product of Dow Chemical) and 3.6 g of MIBK was added dropwise over the course of 15 min, after which the reaction was allowed to stir at 1000 rpm for 6 h. A white milky dispersion was formed. The dispersion was discharged, centrifuged, washed with MIBK, and evaporated to dryness to afford 3.4 g (60% yield) of particles.

Example 14

Synthesis of Un-Encapsulated Core Particles from 2-methylimidazole, DGEBA, and "Purified" HyPox™ RK 84 (14)

A three-necked round bottom flask, equipped with a PTFE fluoropolymer half moon-shaped overhead stirrer, a reflux condenser, an addition funnel, and an argon gas inlet was charged with 0.52 g of the CTBN-epoxy adduct of Example 2, 1.64 g (0.02 mole) of 2-methylimidazole, 5.1 g of heptane and 46.8 g of 4-methyl-2-pentanone (MIBK). The reactor was placed in an 80° C. bath and purged with argon and stirred for 1 h at 300 rpm. A solution of 3.5 g (0.02 equivalent weight) DER™ 332 (a product of Dow Chemical) and 3.5 g of MIBK was added dropwise over the course of 15 min, after which the reaction was allowed to stir at 300 rpm for 1 hr and then at 1000 rpm for another 5 h. A white milky dispersion was formed. The dispersion was discharged, centrifuged, washed with MIBK and evaporated to dryness to afford 3.2 g (57% yield) of particles.

Example 15

Synthesis of Un-Encapsulated Core Particles from 2-methylimidazole, DGEBA, and HyPox™ RK 84 (15)

The un-encapsulated core particles (15) were synthesized from 0.51 g of the CTBN-epoxy adduct of Example 2, 1.64 g (0.02 mole) of 2-methylimidazole, 3.5 g (0.02 equivalent weight) DER™ 332, 15.3 g of heptane and 34 g of MIBK using the procedure of Example 13. The reaction was allowed to stir at 1000 rpm for 6 h under an argon atmosphere to afford 4.5 g (80% yield) of particles.

Example 16

Synthesis of Un-Encapsulated Core Particles from 2-methylimidazole, DGEBA, and HyPox™ RK 84 (16)

The un-encapsulated core particles 16 were synthesized from 0.52 g of the CTBN-epoxy adduct of Example 2, 1.64 g (0.02 mole) of 2-methylimidazole, 3.5 g (0.02 equivalent weight) DER™ 332, 2.6 g of heptane and 49 g of MIBK using the procedure of Example 13 and the reaction was allowed to stir at 1000 rpm for 6 h under an argon atmosphere to afford 2.4 g (42.4% yield) of particles.

Example 17

Synthesis of Un-Encapsulated Core Particles from 2-methylimidazole, DGEBA, and HyPox™ RK 84 (17)

The un-encapsulated core particles 17 were synthesized from 0.52 g of the CTBN-epoxy adduct of Example 2, 1.64 g (0.02 mole) of 2-methylimidazole, 3.5 g (0.02 equivalent weight) DER™ 332, 10.2 g of heptane and 41 g of MIBK using the procedure of Example 13. The reaction was allowed to stir at 1000 rpm for 6 h under an argon atmosphere to afford 3.9 g (69% yield) of particles.

Example 18

Synthesis of Un-Encapsulated Core Particles from 2-methylimidazole, DGEBA, and HyPox™ RK 84 (18)

A three-necked round bottom flask, equipped with a PTFE fluoropolymer half moon-shaped overhead stirrer, a reflux condenser, an addition funnel, and an argon gas inlet was charged with 0.52 g of the CTBN-epoxy adduct of Example 2, 1.64 g (0.02 mole) of 2-methylimidazole, and 47.3 g of 4-methyl-2-pentanone (MIBK). The reactor was placed in an 80° C. bath, and purged with argon. After the reaction was allowed to stir at 300 rpm for 1 hr, a solution of 3.5 g (0.02 equivalent weight) DER™ 332 (a product of Dow Chemical) and 3.5 g of MIBK was added dropwise over the course of 15 min, after which the reaction was allowed to stir at 300 rpm for 1 h and then 1000 rpm for another 5 h. A white milky dispersion was formed. The dispersion was discharged, centrifuged, washed with MIBK, and evaporated to dryness to afford 4.53 g (80% yield) of particles.

Example 19

Synthesis Un-Encapsulated Core Particles from 2-methylimidazole, DGEBA, and HyPox™ RK 84 (19)

The un-encapsulated core particles 19 were synthesized from 0.51 g of the CTBN-epoxy adduct of Example 2, 1.64 g (0.02 mole) of 2-methylimidazole, 3.5 g (0.02 equivalent weight) DER™ 332, and 51 g of MIBK using the procedure of Example 13 and the reaction was allowed to stir at 1500 rpm for 6 h under an argon atmosphere to afford 4.05 g (71.5% yield) of particles.

Example 20

Synthesis of Un-Encapsulated Core Particles from 2-methylimidazole, DGEBA, and HyPox™ RK 84 (20)

The un-encapsulated core particles 20 were synthesized from 0.52 g of the CTBN-epoxy adduct of Example 2, 1.64 g (0.02 mole) of 2-methylimidazole, 3.5 g (0.02 equivalent weight) DER™ 332, 7.6 g of heptane, and 43 g of MIBK using the procedure of Example 13 and the reaction was allowed to stir at 1000 rpm for 6 h to afford 4.05 g (71.5% yield) of particles.

Example 21

Synthesis of Un-Encapsulated Core Particles from 2-methylimidazole, DGEBA, and HyPox™ RK 84 (21)

The un-encapsulated core particles 21 were synthesized from 0.51 g of the CTBN-epoxy adduct from Example 2, 1.65 g (0.02 mole) of 2-methylimidazole, 3.5 g (0.02 equivalent weight) DER™ 332, 7.6 g of heptane and 43 g of MIBK using the procedure of Example 13. The reaction was allowed to stir at 1000 rpm for 16 h to afford 3.6 g (64% yield) of particles.

Example 22

Synthesis of Un-Encapsulated Core Particles from 2-methylimidazole, DGEBA, and HyPox™ RK 84 (22)

Figure 2:
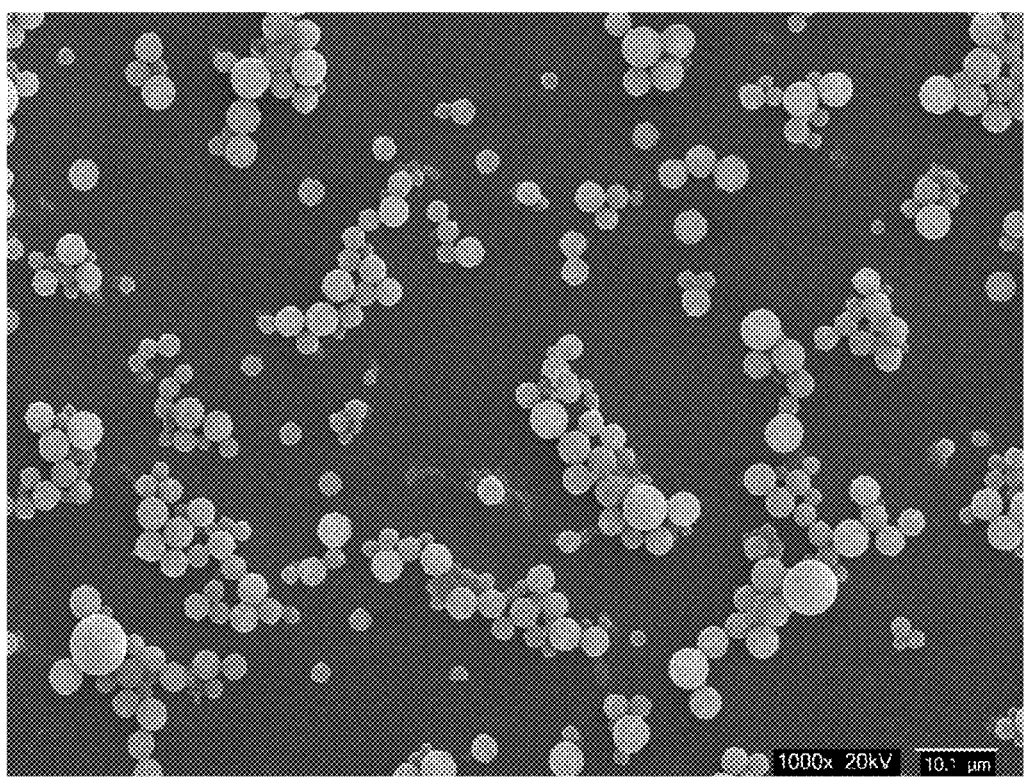
FIG. 2 is an electron micrograph of core particles of spherical shape comprised of 2-methylimidazole, diglycidyl ether of bisphenol A (DGEBA), and the CTBN-epoxy adduct isolated from CVC Thermoset Materials HyPox™ RK84.

The un-encapsulated core particles 22 were synthesized from 0.51 g of the CTBN-epoxy adduct from Example 2, 1.64 g (0.02 mole) of 2-methylimidazole, 3.85 g (0.022 equivalent weight) DER™ 332, 7.6 g of heptane, and 43 g of MIBK using the procedure of Example 13. The reaction was allowed to stir at 1000 rpm for 6 h under an argon atmosphere to afford 4.95 g (82.3% yield) of particles. A small drop of the dispersion was diluted with MIBK, coated on glass slide, and dried under vacuum at room temperature. The dried sample was sputtered with a thin layer of gold and its electron micrograph (FIG. 1 and FIG. 2) taken with a Hitachi S-2460N scanning electron microscope.

Example 23

Synthesis of Un-Encapsulated Core Particles from 2-methylimidazole, DGEBA, and HyPox™ RK 84 (23)

The un-encapsulated core particles 23 were synthesized from 0.51 g of the CTBN-epoxy adduct from Example 2, 1.64 g (0.02 mole) of 2-methylimidazole, 3.85 g (0.022 equivalent weight) DER™ 332, 7.6 g of heptane and 42 g of MIBK using the procedure of Example 13. The reaction was allowed to stir at 1000 rpm for 16 h to afford 4.49 g (74.7% yield) of particles.

Examples for the Encapsulation of the Un-Encapsulated Core Particles

Example 24

Encapsulated Particles from 2-methylimidazole, DGEBA, HyPox™ RK 84, and MDI (24)

Figure 3:
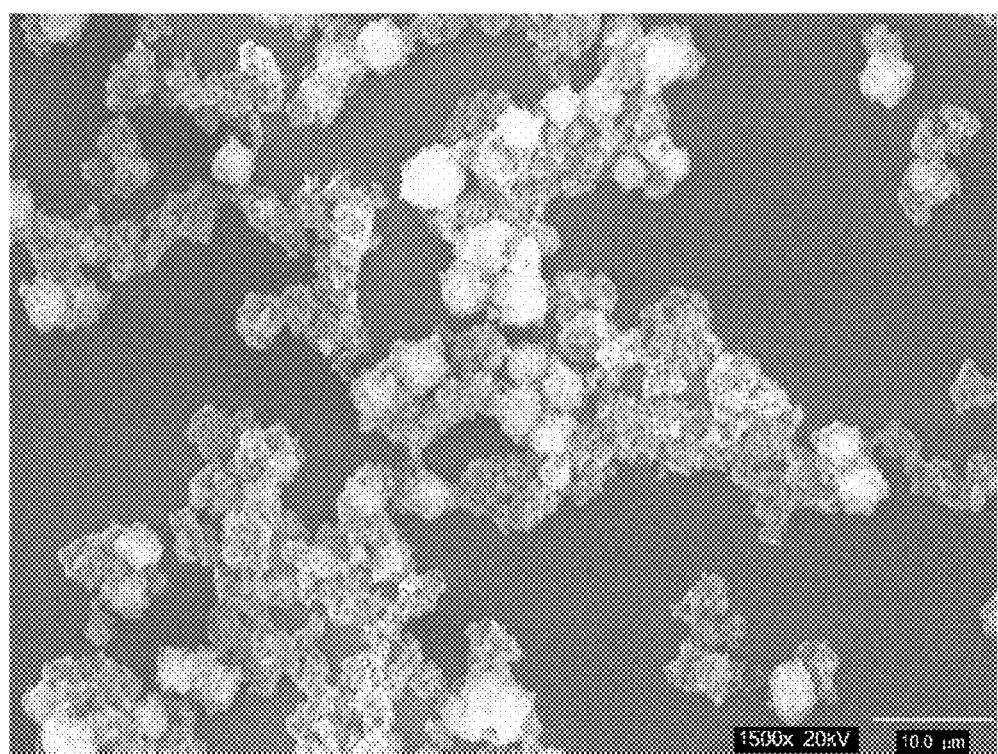
FIG. 3 is an electron micrograph of core particles of spherical shape comprised of 2-methylimidazole, diglycidyl ether of bisphenol A (DGEBA), and the CTBN-epoxy adduct isolated from CVC Thermoset Materials HyPox™ RK84, wherein the core particle is encapsulated with 4,4'-methylenebis(phenyl isocyanate) (MDI).
Figure 4:
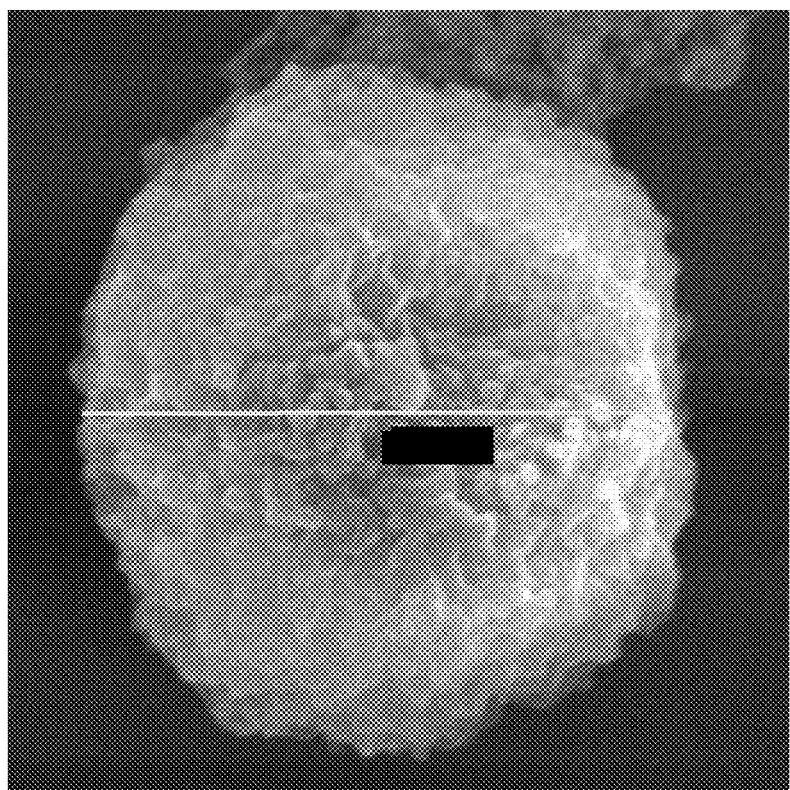
FIG. 4 is an electron micrograph of a single core particle of spherical shape comprised of 2-methylimidazole, diglycidyl ether of bisphenol A (DGEBA), and the CTBN-epoxy adduct isolated from CVC Thermoset Materials HyPox™ RK84.

The microcapsule core was synthesized from 0.52 g of the CTBN-epoxy adduct from Example 2, 1.64 g (0.02 mole) of 2-methylimidazole, 3.85 g (0.022 equivalent weight) DER™ 332, 7.6 g of heptane and 42 g of MIBK using the procedure of Example 13. The reaction was allowed to stir at 1000 rpm for 6 h under an argon atmosphere. A small drop of the dispersion was removed, diluted with MIBK, coated on glass slide, and dried under vacuum at room temperature. The dried sample was sputter-coated with a thin layer of gold and the electron micrograph taken with a Hitachi S-2460N scanning electron microscope. The encapsulation was started by adding a solution of 1.56 g (0.0125 equivalent weight) of 4,4'-Methylenebis(phenyl isocyanate), most commonly referred to as MDI, and 14.1 g of MIBK, which was added dropwise over the course of 110 min, after which the reaction was allowed to stir at 1000 rpm for 15 h under an argon atmosphere. A small drop of the dispersion was dried and its FT-IR spectrum showed complete conversion of the isocyanate moiety. After it was confirmed all of the isocyanate had been consumed, a small drop of the dispersion was removed, diluted with additional MIBK, coated on glass slide, and dried under vacuum at room temperature. The dried sample was sputtered with a thin layer of gold and its electron micrograph taken with a Hitachi S-2460N scanning electron microscope (FIG. 3 and FIG. 4).

Example 25

Synthesis Microcapsules from 2-methylimidazole, DGEBA, HyPox™ RK 84, MDI, and 4,4'-Methylenebis(N,N-diglycidylaniline) (25)

The microcapsule core was synthesized from 0.51 g of the CTBN-epoxy adduct from Example 2, 1.64 g (0.02 mole) of 2-methylimidazole, 3.85 g (0.022 equivalent weight) DER™ 332, 7.6 g of heptane and 42 g of MIBK using the procedure of Example 13 and the reaction was allowed to stir at 1000 rpm for 6 hr under an argon atmosphere. The encapsulation was started by adding a solution of 1.4 g (0.0112 equivalent weight) of MDI, 0.16 g (0.00038 equivalent weight) of 4,4'-Methylenebis(N,N-diglycidylaniline), and 14.1 g of MIBK, which was added dropwise over the course of 110 min, after which the reaction was allowed to stir at 1000 rpm for 15 h under an argon atmosphere. A small drop of dispersion was dried and its FT-IR spectrum showed complete conversion of the isocyanate moiety.

Example 26

Synthesis of Microcapsules from 2-methylimidazole, DGEBA, HyPox™ RK 84, and MDI (26)

The microcapsule core was synthesized from 0.52 g of the CTBN-epoxy adduct from Example 2, 1.64 g (0.02 mole) of 2-methylimidazole, 3.86 g (0.022 equivalent weight) DER™ 332, 7.6 g of heptane, and 42 g of MIBK using the procedure of Example 13. The reaction was allowed to stir at 1000 rpm for 6 h under an argon atmosphere. The encapsulation was performed by the addition of a solution of 1.57 g (0.0125 equivalent weight) of MDI and 14.1 g of MIBK, which was added dropwise over the course of 90 min, after which the reaction was allowed to stir at 1000 rpm for 15 h under an argon atmosphere. A small drop of dispersion was dried and its FT-IR spectrum showed complete conversion of the isocyanate moiety.

Example 27

Synthesis of Microcapsules from 2-methylimidazole, DGEBA, HyPox™ RK 84, MDI, and 4,4'-Methylenebis(N,N-diglycidylaniline) (27)

The microcapsule core was synthesized from 0.52 g of the CTBN-epoxy adduct from Example 2, 1.64 g (0.02 mole) of 2-methylimidazole, 3.85 g (0.022 equivalent weight) DER™ 332, 7.6 g of heptane and 43 g of MIBK using the procedure of Example 13 and the reaction was allowed to stir at 1000 rpm for 6 hr under an argon atmosphere. The encapsulation was started by adding a solution of 2.8 g (0.0223 equivalent weight) of MDI (a product of Sigma Aldrich), 0.35 g (0.0033 equivalent weight) of 4,4'-Methylenebis(N,N-diglycidylaniline), and 14.1 g of MIBK, which was added dropwise over the course of 240 min, after which the reaction was allowed to stir at 1000 rpm for 15 h under an argon atmosphere.

Example 28

Synthesis of Microcapsules from 2-methylimidazole, DGEBA, HyPox™ RK 84, MDI, and 4,4'-Methylenebis(N,N-diglycidylaniline) (28)

A three-necked round bottom flask, equipped with a PTFE fluoropolymer half moon-shaped overhead stirrer, a reflux condenser, an addition funnel, and an argon gas inlet was charged with 1.03 g of the CTBN-epoxy adduct from Example 2, 3.28 g (0.04 mole) of 2-methylimidazole, 15.2 g of heptane and 76 g of 4-methyl-2-pentanone (MIBK). The reactor was placed in an 80° C. bath and purged with argon. After 1 hr, a solution of 7.7 g (0.044 equivalent weight) DER™ 332 (a product of Dow Chemical) and 7.7 g of MIBK was added drop wise over the course of 40 min, after which the reaction was allowed to stir at 1000 rpm for 6 hr under an argon atmosphere. A white milky dispersion was formed. A small drop of the dispersion was diluted, coated on glass slide and dried in vacuum oven at room temperature. The dried sample was sputtered with a thin layer of Au and taken scanning electron micrographs. The encapsulation was started by adding a solution of 2.8 g (0.0223 equivalent weight) of MDI, 0.32 g (0.003 equivalent weight) of 4,4'-Methylenebis(N,N-diglycidylaniline), and 28.2 g of MIBK, which was added dropwise over the course of 240 min, after which the reaction was allowed to stir at 1000 rpm for 12.5 hr under an argon atmosphere.

Example 29

Synthesis of Microcapsules from 2-methylimidazole, DGEBA, HyPox™ RK 84L, Desmodur® W, and 4,4'-Methylenebis(N,N-diglycidylaniline) (29)

A three-necked round bottom flask, equipped with a PTFE fluoropolymer half moon-shaped overhead stirrer, a reflux condenser, an addition funnel, and an argon gas inlet was charged with 2.09 g of the CTBN-epoxy adduct from Example 2, 6.56 g (0.08 mole) of 2-methylimidazole and 183 g of 4-methyl-2-pentanone (MIBK). The reactor was placed in an 80° C. bath and purged with argon. After 1 hr, a solution of 15.4 g (0.088 equivalent weight) DER™ 332 (diglycidyl ether of bisphenol A (DGEBA) from Dow Chemical) and 18.7 g of MIBK was added drop wise over the course of 1 hr, after which the reaction was allowed to stir at 1000 rpm for 6 hr under an argon atmosphere. A white milky dispersion was formed. The particles were allowed to precipitate under gravity allowing the supernatant liquid was removed by decantation. The particles were redispersed in MIBK. The residual dispersion was filtered through a small pore size membrane filter. The particles were redispersed in MIBK and then filtered through a 30 µm pore size filter to remove large-sized particles and aggregates. A few drops of the resulting dispersion were dried, sputtered with gold, loaded into an SEM. Its micrograph showed the particles were of adequate quality to be allowed to proceed on to the encapsulation step. The solid content of the dispersion was measured at 9.84% (w/w). The yield of total dispersion was 84.4 g.

A three-neck round bottom flask, equipped with a PTFE fluoropolymer half moon-shaped overhead stirrer, a reflux condenser, an addition funnel, and an argon gas inlet was charged with 0.83 g of the CTBN-epoxy adduct from Example 2, 10.3 g of MIBK, and the purified dispersion. The reactor was placed in an 80° C. bath and purged with argon. To this, 17 g of heptane was added drop-wise over the course of 1 hr. The encapsulation was started by adding a solution of 1.9 g (0.0145 equivalent weight) of Desmodur® W (a liquid cycloaliphatic diisocyanate from Bayer MaterialScience), 0.19 g (0.002 equivalent weight) of 4,4'-Methylenebis(N,N-diglycidylaniline), and 18.9 g of MIBK, which was added drop-wise over the course of 4 hr, after which the reaction was allowed to stir at 1000 rpm for 12.5 hr under an argon atmosphere.

Example 30 (Prophetic)

Synthesis of Microcapsules Comprised of Two Shell Materials

A three-necked round bottom flask, equipped with a PTFE fluoropolymer half moon-shaped overhead stirrer, a reflux condenser, an addition funnel, and an argon gas inlet is charged with 2.09 g of the CTBN-epoxy adduct from Example 2, 6.56 g (0.08 mole) of 2-methylimidazole and 183 g of 4-methyl-2-pentanone (MIBK). The reactor is placed in an 80° C. bath and purged with argon. After 1 hr, a solution of 15.4 g (0.088 equivalent weight) DER™ 332 (a product of Dow Chemical) and 18.7 g of MIBK is added drop-wise over the course of 1 hr, after which the reaction is allowed to stir at 1000 rpm for 6 hr under an argon atmosphere. A white milky dispersion is formed. The particles are allowed to precipitate under gravity allowing the supernatant liquid to be removed by decantation. The particles are redispersed in MIBK. The residual dispersion is filtered through a small pore size membrane filter. The particles are redispersed in MIBK and then filtered through a 30 µm pore size filter to remove large-sized particles and aggregates.

A three-neck round bottom flask, equipped with a PTFE fluoropolymer half moon-shaped overhead stirrer, a reflux condenser, an addition funnel, and an argon gas inlet is charged with 0.83 g of the CTBN-epoxy adduct from Example 2, 10.3 g of MIBK, and the purified dispersion. The reactor is placed in an 80° C. bath and purged with argon. To this, 17 g of heptane is added drop-wise over the course of 1 hr. The encapsulation with the first shell layer was started by adding a solution of 1.9 g (0.0145 equivalent weight) of Desmodur® W (a product of Bayer MaterialScience), 0.19 g (0.002 equivalent weight) of 4,4'-Methylenebis(N,N-diglycidylaniline), and 18.9 g of MIBK is added drop-wise over the course of 4 hr, after which the reaction is allowed to stir at 1000 rpm for 12.5 hr under an argon atmosphere.

The second shell layer is formed by the addition of a solution of 1.9 g (0.0145 equivalent weight) of Desmodur® W (a product of Bayer MaterialScience), 0.19 g (0.002 equivalent weight) of 4,4'-Methylenebis(N,N-diglycidylaniline), and 18.9 g of MIBK is added drop-wise over the course of 4 hr, after which the reaction is allowed to stir at 1000 rpm for 12.5 hr under an argon atmosphere.

Example 31 (Prophetic)

Synthesis of Microcapsules Comprised of Two Shell Materials, where the Outermost Shell Material is Comprised of an Epoxy Compatible Material A three-necked round bottom flask, equipped with a PTFE fluoropolymer half moon-shaped overhead stirrer, a reflux condenser, an addition funnel, and an argon gas inlet is charged with 2.09 g of the CTBN-epoxy adduct from Example 2, 6.56 g (0.08 mole) of 2-methylimidazole and 183 g of 4-methyl-2-pentanone (MIBK). The reactor is placed in an 80° C. bath and purged with argon. After 1 hr, a solution of 15.4 g (0.088 equivalent weight) DER™ 332 (a product of Dow Chemical) and 18.7 g of MIBK is added drop-wise over the course of 1 hr, after which the reaction is allowed to stir at 1000 rpm for 6 hr under an argon atmosphere. A white milky dispersion is formed. The particles are allowed to precipitate under gravity allowing the supernatant liquid to be removed by decantation. The particles are redispersed in MIBK. The residual dispersion is filtered through a small pore size membrane filter. The particles are redispersed in MIBK and then filtered through a 30 µm pore size filter to remove large-sized particles and aggregates.

A three-neck round bottom flask, equipped with a PTFE fluoropolymer half moon-shaped overhead stirrer, a reflux condenser, an addition funnel, and an argon gas inlet is charged with 0.83 g of the CTBN-epoxy adduct from Example 2, 10.3 g of MIBK, and the purified dispersion. The reactor is placed in an 80° C. bath and purged with argon. To this, 17 g of heptane is added drop-wise over the course of 1 hr. The first shell layer encapsulation was started by adding a solution of 1.9 g (0.0145 equivalent weight) of Desmodur® W (a product of Bayer MaterialScience), 0.19 g (0.002 equivalent weight) of 4,4'-Methylenebis(N,N-diglycidylaniline), and 18.9 g of MIBK is added drop-wise over the course of 4 hr, after which the reaction is allowed to stir at 1000 rpm for 12.5 hr under an argon atmosphere.

The second shell layer is formed by the addition of a solution of 1.9 g (0.0145 equivalent weight) of Desmodur® W (a product of Bayer MaterialScience), 1.9 g of CVC Thermoset Materials HyPox™ RA1340, and 18.9 g of MIBK is added drop-wise over the course of 4 hr, after which the reaction is allowed to stir at 1000 rpm for 12.5 hr under an argon atmosphere.

Example 32 (Prophetic)

Synthesis of Microcapsules Comprised of Two Shell Materials, where the Outermost Shell Material is Comprised of an Epoxy Compatible Material A three-necked round bottom flask, equipped with a PTFE fluoropolymer half moon-shaped overhead stirrer, a reflux condenser, an addition funnel, and an argon gas inlet is charged with 2.09 g of the CTBN-epoxy adduct from Example 2, 6.56 g (0.08 mole) of 2-methylimidazole and 183 g of 4-methyl-2-pentanone (MIBK). The reactor is placed in an 80° C. bath and purged with argon. After 1 hr, a solution of 15.4 g (0.088 equivalent weight) DER™ 332 (a product of Dow Chemical) and 18.7 g of MIBK is added drop-wise over the course of 1 hr, after which the reaction is allowed to stir at 1000 rpm for 6 hr under an argon atmosphere. A white milky dispersion is formed. The particles are allowed to precipitate under gravity allowing the supernatant liquid to be removed by decantation. The particles are redispersed in MIBK. The residual dispersion is filtered through a small pore size membrane filter. The particles are redispersed in MIBK and then filtered through a 30 μm pore size filter to remove large-sized particles and aggregates.

A three-neck round bottom flask, equipped with a PTFE fluoropolymer half moon-shaped overhead stirrer, a reflux condenser, an addition funnel, and an argon gas inlet is charged with 0.83 g of the CTBN-epoxy adduct from Example 2, 10.3 g of MIBK, and the purified dispersion. The reactor is placed in an 80° C. bath and purged with argon. To this, 17 g of heptane is added drop-wise over the course of 1 hr. The encapsulation was started by adding a solution of 1.9 g (0.0145 equivalent weight) of Desmodur® W (a product of Bayer MaterialScience), 0.19 g (0.002 equivalent weight) of 4,4'-Methylenebis(N,N-diglycidylaniline), and 18.9 g of MIBK is added drop-wise over the course of 4 hr, after which the reaction is allowed to stir at 1000 rpm for 12.5 hr under an argon atmosphere.

The second shell layer is formed by the addition of a solution of 1.9 g (0.0145 equivalent weight) of Desmodur® W (a product of Bayer MaterialScience), 1.9 g of Toagosei GP-301 graft polyacrylate, 0.19 g (0.002 equivalent weight) of 4,4'-Methylenebis(N,N-diglycidylaniline), and 18.9 g of MIBK is added drop-wise over the course of 4 hr, after which the reaction is allowed to stir at 1000 rpm for 12.5 hr under an argon atmosphere.

Examples for the Preparation of the Masterbatch

Example 33

Preparation of the Masterbatch from the Particles of Example 24

The dispersion of the particles of Example 24 were evaporated under vacuum at 50° C. to obtain a yellow solid, ground with a mortar and pestle, and added to diglycidyl ether of bisphenol A in a ratio of 35:65 (w/w) particles to epoxy resin. The mixture was dispersed for 20 min using a three roll mill to obtain a creamy yellow dispersion.

Example 34

Preparation of the Masterbatch from the Particles of Example 28

At room temperature, 10 g of diglycidyl ether of bisphenol A was added to the reaction mixture of Example 28, which contained the dispersion of the particles, and stirred for 3 hr. The solvent was removed under vacuum at 31° C. to a solids content of 86% (w/w). From this, 12.86 g was removed and mixed with and additional 7.90 g of diglycidyl ether of bisphenol A. The mixture was then process further for 3 min using a three-roll mill to obtain a creamy yellow dispersion.

Performance Results:

For the solvent resistance test, mixtures were prepared by combining the particles, diglycidyl ether of bisphenol A, and MIBK in a ratio of 4:50:46 (w/w). The mixtures were then placed in a 40° C. oil bath and monitored visually for a change in viscosity. The results are shown below in Table 1. Aliquots of the mixtures above were coated on glass slides as thin films and dried under vacuum at room temperature. DSC traces were obtained using a TA Instruments Q10 Differential Scanning calorimeter using a temperature window of 30 to 250° C., a heating rate of 5° C./min, and performed under a nitrogen atmosphere. The results are shown below in Table 1.

TABLE 1

The solvent resistance and DSC results of the un-encapsulated and encapsulated particles:
Solvent resistance and DSC results of the un-encapsulated and encapsulated particles

| Particle | Un-encapsulated/ Encapsulated | Solvent resistance Time to gel (h) | DSC $T_{peak}$ (exo, ° C.) | ΔH (J/g) |
|---|---|---|---|---|
| 22 | Un-encapsulated | 14 | 105 | 297 |
| 24 | Encapsulated | 120 | 119 | 330 |
| 25 | Encapsulated | 170 | 124 | 307 |
| 27 | Encapsulated | 240 | 142 | 200 |
| 28 | Encapsulated | 190 | 124 | 218 |

Having described the invention in detail and by reference to specific embodiments thereof it will be apparent to those skilled in the art that numerous variations and modifications are possible without departing from the spirit and scope of the following claims.

What is claimed is:

1. A curing agent for epoxy resins that is comprised of the reaction product of:
   (a) an amine, and
   (b) an epoxy resin, and
   (c) an elastomer-epoxy adduct
wherein the elastomer-epoxy adduct is a carboxyl-terminated butadiene-acrylonitrile (CTBN)-epoxy adduct which functions as a dispersant; wherein the amine is reacted with the dispersant followed by the epoxy resin to produce a dispersion of epoxy resin particles; wherein the particles are encapsulated in a polymer shell that is the reaction product of a multifunctional isocyanate and a multifunctional epoxy compound.

2. The curing agent of claim 1 wherein the nitrile content of the CTBN is about 12-35% by weight.

3. The curing agent of claim 2 wherein the nitrile content is about 20-33% by weight.

* * * * *